(12) United States Patent
Lee et al.

(10) Patent No.: US 7,707,469 B2
(45) Date of Patent: Apr. 27, 2010

(54) MEMORY TEST SYSTEM INCLUDING SEMICONDUCTOR MEMORY DEVICE SUITABLE FOR TESTING AN ON-DIE TERMINATION, AND METHOD THEREOF

(75) Inventors: Woo-Jin Lee, Seongnam-si (KR); Seok-Won Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 413 days.

(21) Appl. No.: 11/892,846

(22) Filed: Aug. 28, 2007

(65) Prior Publication Data

US 2008/0052571 A1 Feb. 28, 2008

(30) Foreign Application Priority Data

Aug. 28, 2006 (KR) ...................... 10-2006-0081449

(51) Int. Cl.
*G11C 29/00* (2006.01)
(52) U.S. Cl. ........................ 714/721; 326/30
(58) Field of Classification Search ................. 713/300; 714/724, 718, 719, 721; 326/30
See application file for complete search history.

(56) References Cited

U.S. PATENT DOCUMENTS

| | | | |
|---|---|---|---|
| 6,721,892 B1 * | 4/2004 | Osborn et al. ............... | 713/300 |
| 6,809,546 B2 | 10/2004 | Song et al. | |
| 6,834,014 B2 | 12/2004 | Yoo et al. | |
| 7,123,047 B2 * | 10/2006 | Lim ............................. | 326/30 |
| 7,180,327 B2 | 2/2007 | So et al. | |
| 7,372,294 B2 * | 5/2008 | Kim ............................. | 326/30 |
| 7,514,955 B2 * | 4/2009 | Kim ............................. | 326/30 |
| 7,525,337 B2 * | 4/2009 | Park et al. ..................... | 326/30 |
| 7,525,339 B2 * | 4/2009 | Lee ............................... | 326/30 |

FOREIGN PATENT DOCUMENTS

| | | |
|---|---|---|
| KR | 10-2003-0008327 | 1/2003 |
| KR | 10-2003-0083237 | 10/2003 |
| KR | 10-2005-0095387 | 9/2005 |

* cited by examiner

*Primary Examiner*—David Ton
(74) *Attorney, Agent, or Firm*—Lee & Morse, P.C.

(57) ABSTRACT

Example embodiments relate to a memory test system having a semiconductor memory device, a coupling circuit and a tester. The semiconductor memory device may include a plurality of first output nodes and a plurality of second output nodes. The first output nodes may be connected to respective first on-die termination circuits that may not be tested, and the second output nodes may be connected to second on-die termination circuits that may be tested. The semiconductor memory device may be configured to generate test signals of the second on-die termination circuits and to provide the test signals to the second output nodes. The coupling circuit may be configured to connect the first output nodes and the second output nodes to communication channels, respectively. The tester may be configured to test a logic state of the test signals of the communication channels.

23 Claims, 7 Drawing Sheets

MEMORY TEST SYSTEM INCLUDING SEMICONDUCTOR MEMORY DEVICE SUITABLE FOR TESTING AN ON-DIE TERMINATION, AND METHOD THEREOF

BACKGROUND OF THE INVENTION

1. Field of the Invention

Example embodiments relate to semiconductor memory devices, and more particularly, to a memory test system including a semiconductor memory device suitable for testing an on-die termination, and method thereof.

2. Description of the Related Art

Generally, semiconductor memory devices, e.g., Dynamic Random Access Memory (DRAM), may be tested for detecting defects in a wafer process and in a packaging process. In order to reduce test time, a parallel test, in which a plurality of semiconductor memory devices may be tested at once, may be employed. One form of parallel testing may be a merged-data line scheme. During the merged-data line scheme, at least two output pins of the semiconductor memory devices may be combined, and a selected output data may be provided to a tester through the combined output pins.

As design and process of the semiconductor memory devices become more developed, a double data rate (DDR) DRAM may be used. In case of DDR DRAM having over 200 MHz, for example, a termination circuit may be used for preventing distortion of signals during transmission of data. A termination technique may include a motherboard termination technique and an on-die termination technique. The motherboard termination technique may be when the termination circuit is located on a mother board. The on-die termination technique may be when the termination circuit is located on a die. Because signal integrity of the on-die termination technique may be higher than that of the mother board termination technique, the on-die termination technique may generally be used.

In a read mode, the on-die termination circuit may be deactivated. In a write mode, the on-die termination circuit may function as a termination resistor. Further, as an operating speed of the semiconductor memory devices may be increased, an efficient test of the on-die termination circuit may also be required.

SUMMARY OF THE INVENTION

Example embodiments are therefore directed to a memory test system including a semiconductor memory device suitable for testing an on-die termination, and method thereof, which substantially overcome one or more of the problems due to the limitations and disadvantages of the related art.

It is therefore a feature of example embodiments to provide a memory test system including a semiconductor memory device suitable for testing an on-die termination circuit.

It is therefore another feature of example embodiments to provide a method of testing an on-die termination circuit in a semiconductor memory device.

It is therefore another feature of example embodiments to test an on-die termination circuit by using a tester having a small number of channels.

At least one of the above and other features of example embodiments may provide a memory test system having a semiconductor memory device, a coupling circuit and a tester. The semiconductor memory device may include a plurality of first output nodes and a plurality of second output nodes. The first output nodes may be connected to respective first on-die termination circuits that may not be tested, and the second output nodes may be connected to second on-die termination circuits that may be tested. The semiconductor memory device may be configured to generate test signals of the second on-die termination circuits and to provide the test signals to the second output nodes. The coupling circuit may be configured to connect the first output nodes and the second output nodes to communication channels, respectively. The tester may be configured to test a logic state of the test signals of the communication channels.

The first output nodes may be maintained at high impedance in an on-die termination test mode.

The memory test system may further include a pull-down circuit configured to pull down voltages of communication channels when the first and second on-die termination circuits are deactivated. The pull-down circuit may include detection resistors respectively connected between each of the communication channels and a ground voltage.

The semiconductor memory device may include output drivers respectively connected to each of the first and second output nodes. The output drivers may be turned off in an on-die termination test mode.

The memory test system may provide a number of first output nodes corresponding to M, a number of second output nodes corresponding to N, and a number of communication channels corresponding to (M+N)/2, M and N being natural numbers. The semiconductor memory device may have eight input/output terminals. The M and N may be equal to four.

The semiconductor memory device may further include a first output driving unit configured to operate in response to an on-die termination enable signal and a first read data mask signal, and a second output driving unit configured to operate in response to the on-die termination enable signal and a second read data mask signal.

The first output driving unit may include a first on-die termination control signal generating circuit configured to generate a first on-die termination control signal in response to the on-die termination enable signal and the first read data mask signal, a first output driver configured to generate first output data in response to first data so as to provide the first output data to a first output node, a first on-die termination circuit configured to operate in response to the first on-die termination control signal, the first on-die termination circuit being connected to the first output node, a second output driver configured to generate second output data in response to second data so as to provide the second output data to a second output node, a second on-die termination circuit configured to operate in response to the first on-die termination control signal, the second on-die termination circuit being connected to the second output node, a third output driver configured to generate third output data in response to third data so as to provide the third output data to a third output node, a third on-die termination circuit configured to operate in response to the first on-die termination control signal, the third on-die termination circuit being connected to the third output node, a fourth output driver configured to generate fourth output data in response to fourth data so as to provide the fourth output data to a fourth output node, and a fourth on-die termination circuit configured to operate in response to the first on-die termination control signal, the fourth on-die termination circuit being connected to the fourth output node.

The first, second, third and fourth data respectively may correspond to output data of a memory core in the semiconductor memory device. The first, second, third and fourth output drivers may be turned off so as to maintain the first, second, third and fourth output nodes at high impedance in the on-die termination test mode.

The second output driving unit may include a second on-die termination control signal generating circuit configured to generate a second on-die termination control signal in response to the on-die termination enable signal and the second read data mask signal, a fifth output driver configured to generate fifth output data in response to fifth data so as to provide the fifth output data to a fifth output node, a fifth on-die termination circuit configured to operate in response to the second on-die termination control signal, the fifth on-die termination circuit being connected to the fifth output node, a sixth output driver configured to generate sixth output data in response to sixth data so as to provide the sixth output data to a sixth output node, a sixth on-die termination circuit configured to operate in response to the second on-die termination control signal, the sixth on-die termination circuit being connected to the sixth output node, a seventh output driver configured to generate seventh output data in response to seventh data so as to provide the seventh output data to a seventh output node, a seventh on-die termination circuit configured to operate in response to the second on-die termination control signal, the seventh on-die termination circuit being connected to the seventh output node, a eighth output driver configured to generate eighth output data in response to eighth data so as to provide the eighth output data to a eighth output node, and a eighth on-die termination circuit configured to operate in response to the second on-die termination control signal, the eighth on-die termination circuit being connected to the eighth output node. The fifth, sixth, seventh and eighth data respectively may correspond to output data of a memory core in the semiconductor memory device. The fifth, sixth, seventh and eighth output drivers may be turned off so as to maintain the fifth, sixth, seventh and eighth output nodes at high impedance in the on-die termination test mode.

The semiconductor memory device may have thirty two input/output terminals. The M and N may correspond to eight.

The semiconductor memory device may include a first output driving unit configured to operate in response to an on-die termination enable signal and a first read data mask signal, a second output driving unit configured to operate in response to the on-die termination enable signal and a second read data mask signal, a third output driving unit configured to operate in response to the on-die termination enable signal and a third read data mask signal, and a fourth output driving unit configured to operate in response to the on-die termination enable signal and a fourth read data mask signal.

The first output driving unit may include a first on-die termination control signal generating circuit configured to generate a first on-die termination control signal in response to the on-die termination enable signal and the first read data mask signal, a first output driver configured to generate first output data in response to first data so as to provide the first output data to a first output node, a first on-die termination circuit configured to operate in response to the first on-die termination control signal, the first on-die termination circuit being connected to the first output node, a second output driver configured to generate second output data in response to second data so as to provide the second output data to a second output node, a second on-die termination circuit configured to operate in response to the first on-die termination control signal, the second on-die termination circuit being connected to the second output node, a third output driver configured to generate third output data in response to third data so as to provide the third output data to a third output node, a third on-die termination circuit configured to operate in response to the first on-die termination control signal, the third on-die termination circuit connected to the third output node, a fourth output driver configured to generate fourth output data in response to fourth data so as to provide the fourth output data to a fourth output node; a fourth on-die termination circuit configured to operate in response to the first on-die termination control signal, the fourth on-die termination circuit being connected to the fourth output node, a fifth output driver configured to generate fifth output data in response to fifth data so as to provide the fifth output data to a fifth output node, a fifth on-die termination circuit configured to operate in response to the first on-die termination control signal, the fifth on-die termination circuit being connected to the fifth output node, a sixth output driver configured to generate sixth output data in response to sixth data so as to provide the sixth output data to a sixth output node, a sixth on-die termination circuit configured to operate in response to the first on-die termination control signal, the sixth on-die termination circuit being connected to the sixth output node, a seventh output driver configured to generate seventh output data in response to seventh data so as to provide the seventh output data to a seventh output node, a seventh on-die termination circuit configured to operate in response to the first on-die termination control signal, the seventh on-die termination circuit being connected to the seventh output node, a eighth output driver configured to generate eighth output data in response to eighth data so as to provide the eighth output data to a eighth output node, and a eighth on-die termination circuit configured to operate in response to the first on-die termination control signal, the eighth on-die termination circuit being connected to the eighth output node.

The semiconductor memory device may include an output driving circuit configured to generate output data in response to data so as to output the output data in an active mode, and a memory core configured to generate the data.

At least one of the above and other features of example embodiments may provide a method of testing a semiconductor memory device. The method may include providing a plurality of first output nodes and a plurality of second output nodes, the first output nodes being connected to first on-die termination circuits that are not tested, and the second output nodes being connected to second on-die termination circuits that are tested, generating test signals of the second on-die termination circuits to provide the test signals to the second output nodes in an on-die termination test mode, coupling the first output nodes and the second output nodes to communication channels, respectively, and testing a logic state of the test signals of the communication channels.

BRIEF DESCRIPTION OF THE DRAWINGS

The above and other features and advantages of example embodiments will become more apparent to those of ordinary skill in the art by describing in detail example embodiments thereof with reference to the attached drawings, in which.

DETAILED DESCRIPTION OF THE INVENTION

Korean Patent Application No. 2006-81449, filed on Aug. 28, 2006 in the Korean Intellectual Property Office, and entitled: "Semiconductor Memory Device Suitable for Testing on-Die Termination, Memory Test System Including the Same, and Method of Testing on-Die Termination," is incorporated herein by reference in its entirety.

Example embodiments will now be described more fully hereinafter with reference to the accompanying drawings. The invention may, however, be embodied in different forms and should not be construed as limited to the embodiments set forth herein. Rather, these example embodiments are provided so that this disclosure will be thorough and complete, and will fully convey the scope of the invention to those skilled in the art.

Figure 1:
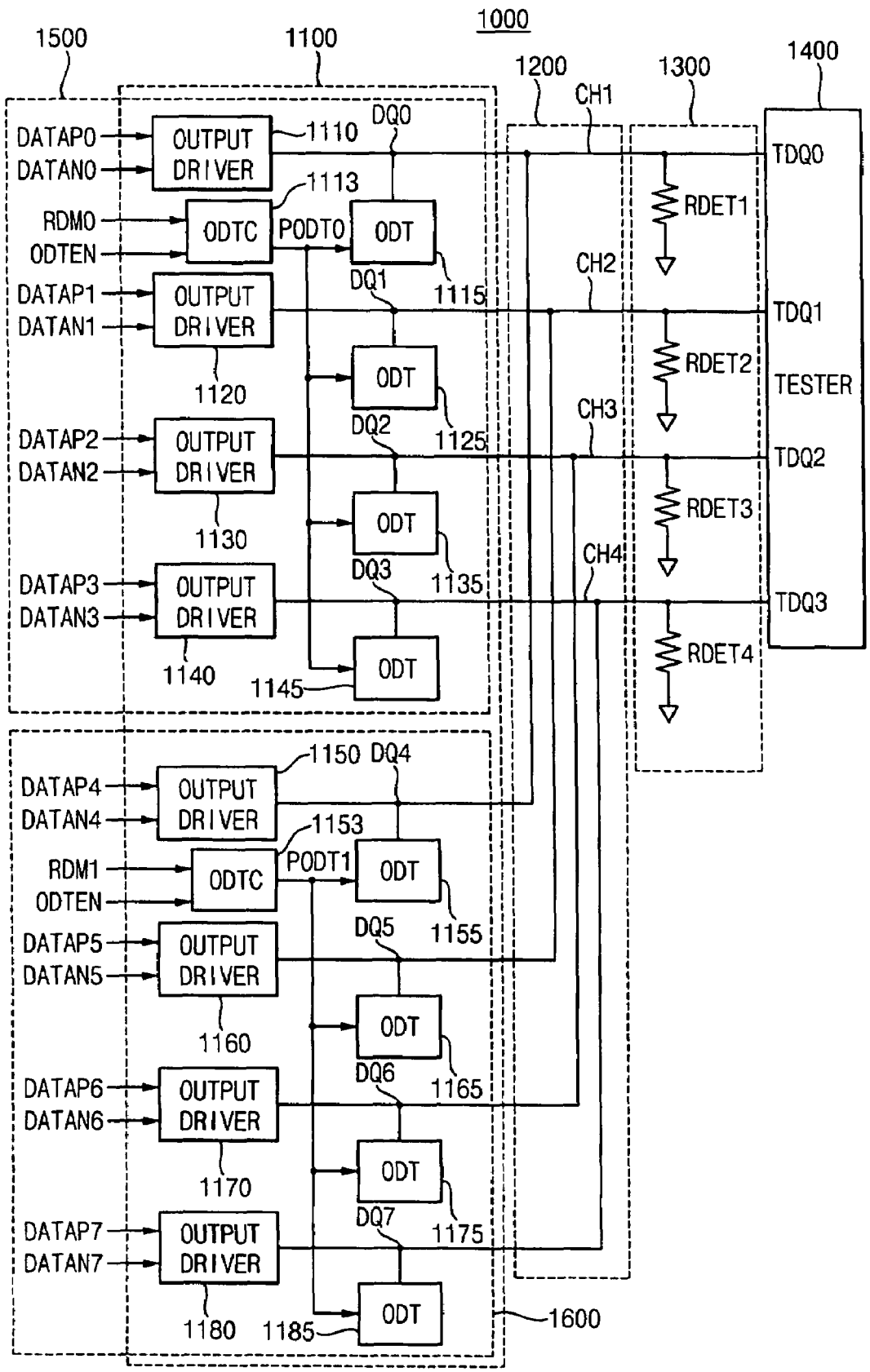
FIG. 1 illustrates a circuit diagram of a memory test system including a semiconductor memory device according to an example embodiment.

FIG. 1 illustrates a circuit diagram of a memory test system including a semiconductor memory device according to an example embodiment.

Referring to FIG. 1, a memory test system 1000 may include a semiconductor memory device 1100, a coupling circuit 1200, a pull-down circuit 1300 and a tester 1400. The memory test system 1000 may test an on-die termination circuit of the semiconductor memory device 1100 having eight input/output terminals, for example. It should be appreciated that the semiconductor memory device 1100 may include other components, such as, but not limited to, a memory core. Both output nodes and output pins may be commonly represented by DQ0 through DQ7 (as illustrated in FIG. 1) because output nodes of the semiconductor memory device 1100 may be respectively coupled to output pins.

The semiconductor memory device 1100 may maintain the output nodes DQ0 through DQ7 at high impedance by turning off the output driving circuit in an on-die termination circuit.

The semiconductor memory device 1100 may include output drivers 1110, 1120, 1130, 1140, 1150, 1160, 1170 and 1180, on-die termination control signal generating circuits 1113 and 1153 and on-die termination circuits 1115, 1125, 1135, 1145, 1155, 1165, 1175 and 1185. The semiconductor memory device 1100 may include a first output driving unit 1500 and a second output driving unit 1600. The first output driving unit 1500 may include the output drivers 1110, 1120, 1130 and 1140, the on-die termination control signal generating circuit 1113, and the on-die termination circuits 1115, 1125, 1135 and 1145. The second output driving unit 1600 may include the output drivers 1150, 1160, 1170 and 1180, the on-die termination control signal generating circuit 1153, and the on-die termination circuits 1155, 1165, 1175 and 1185. The first output driving unit 1500 may operate in response to a read data mask signal RDM0 and an on-die termination enable signal ODTEN. The second output driving unit 1600 may operate in response to a read data mask signal RDM1 and the on-die termination enable signal ODTEN.

The output driver 1110 may generate output data by receiving a pair of data DATAP0 and DATAN0, and may provide the output data to the output node DQ0. The on-die termination control signal generating circuit 1113 may generates an on-die termination control signal PODT0 in response to the read data mask signal RDM0 and the on-die termination enable signal ODTEN. The on-die termination circuit 1115 may generate a termination resistance in response to the on-die termination control signal PODT0, and may provide the termination resistance to the output node DQ0. The output driver 1120 may generate output data by receiving a pair of data DATAP1 and DATAN1, and may provide the output data to the output node DQ1. The on-die termination circuit 1125 may generate a termination resistance in response to the on-die termination control signal PODT0, and may provide the termination resistance to the output node DQ1. The output driver 1130 may generate output data by receiving a pair of data DATAP2 and DATAN2, and may provide the output data to the output node DQ2. The on-die termination circuit 1135 may generate a termination resistance in response to the on-die termination control signal PODT0, and may provide the termination resistance to the output node DQ2. The output driver 1140 may generate output data by receiving a pair of data DATAP3 and DATAN3, and may provide the output data to the output node DQ3. The on-die termination circuit 1145 may generate a termination resistance in response to the on-die termination control signal PODT0, and may provide the termination resistance to the output node DQ3.

The output driver 1150 may generate output data by receiving a pair of data DATAP4 and DATAN4, and may provide the output data to the output node DQ4. The on-die termination control signal generating circuit 1153 may generate an on-die termination control signal PODT1 in response to the read data mask signal RDM1 and the on-die termination enable signal ODTEN. The on-die termination circuit 1155 may generate a termination resistance in response to the on-die termination control signal PODT1, and may provide the termination resistance to the output node DQ4. The output driver 1160 may generate output data by receiving a pair of data DATAP5 and DATAN5, and may provide the output data to the output node DQ5. The on-die termination circuit 1165 may generate a termination resistance in response to the on-die termination control signal PODT1, and may provide the termination resistance to the output node DQ5. The output driver 1170 may generate output data by receiving a pair of data DATAP6 and DATAN6, and may provide the output data to the output node DQ6. The on-die termination circuit 1175 may generate a termination resistance in response to the on-die termination control signal PODT1, and may provide the termination resistance to the output node DQ6. The output driver 1180 may generate output data by receiving a pair of data DATAP7 and DATAN7, and may provide the output data to the output node DQ7. The on-die termination circuit 1185 may generate a termination resistance in response to the on-die termination control signal PODT1, and may provide the termination resistance to the output node DQ7.

The coupling circuit 1200 may respectively couple the output nodes DQ0 through DQ3 of the first output driving unit 1500 and the output nodes DQ4 through DQ7 of the second output driving unit 1600 to communication channels CH1 through CH4. The pull-down circuit 1300 may include resistors RDET1 through RDET4 respectively coupled to the communication channels CH1 through CH4. The pull-down circuit 1300 may respectively pull down voltages of the communication channels CH1 through CH4. The tester 1400 may include input/output pins TDQ0 through TDQ3 and may test a logic state of a voltage of the communication channels CH1 through CH4. As illustrated in FIG. 1, the on-die termination control signal generating circuits 1113 and 1153 may be separately located, e.g., in the first output driving unit 1500 and in the second output driving unit 1600. However, it should be appreciated that the on-die termination control signal generating circuits 1113 and 1153 may be implemented in a single circuit, e.g., the semiconductor memory device 1100 may include on-die termination control signal generating circuits that may generate the on-die termination control signals PODT1 and PODT1 in response to the read data mask signals RDM0 and RDM1 and the on-die termination enable signal ODTEN.

Figure 2:
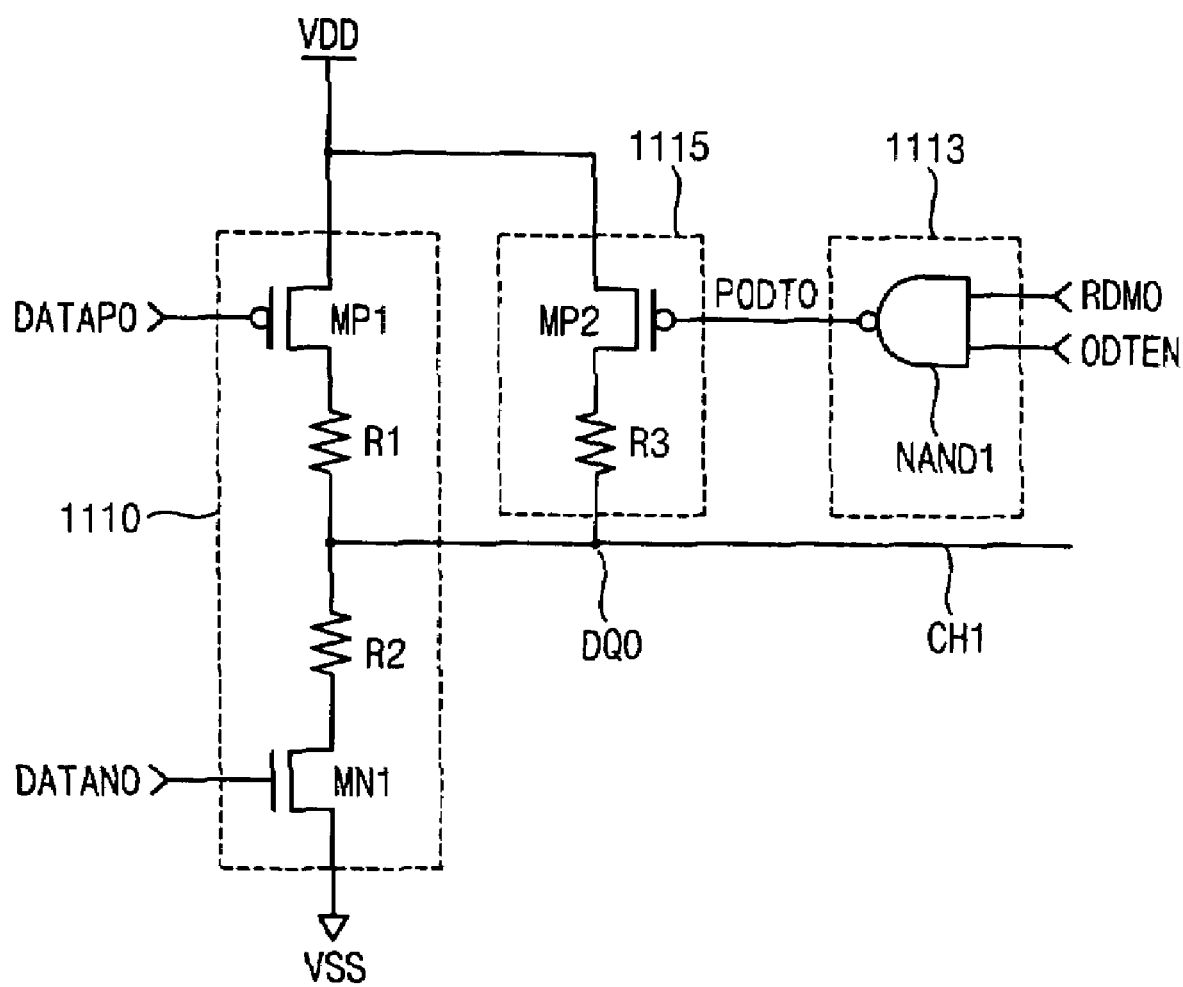
FIG. 2 illustrates a circuit diagram of a portion of an output driving circuit of the semiconductor memory device in FIG. 1.

FIG. 2 illustrates a circuit diagram of a portion of an output driving circuit of the semiconductor memory device 1000 in FIG. 1 in accordance with an example embodiment.

Referring to FIG. 2, the output driver 1110 may include a p-channel metal oxide semiconductor (PMOS) transistor MP1, an n-channel metal oxide semiconductor (NMOS) transistor MN1 and resistors R1 and R2. The PMOS transistor MP1 may pull up a voltage of an output node DQ0 in response to data DATAP0, and the NMOS transistor MN1 may pull down the voltage of the output node DQ0 in response to data DATAN0. The resistor R1 may be connected between a drain of the PMOS transistor MP1 and the output node DQ0. The resistor R2 may be connected between a drain of the NMOS transistor MN1 and the output node DQ0. The resistors R1 and R2 may determine a swing width (or swing voltage) of the output voltage of the output node DQ0.

The on-die termination control signal generating circuit 1113 may include a NAND gate (which may perform a NAND operation on the read data mask signals RDM0) and the on-die termination enable signal ODTEN to generate the on-die termination control signal PODT0. The on-die termination circuit 1115 may include a PMOS transistor MP2 and an on-die termination resistor R3. The PMOS transistor MP2 may perform a switching operation in response to the on-die termination control signal PODT0. The on-die termination resistor R3 may be connected between a drain of the PMOS transistor MP2 and the output node DQ0. The output node DQ0 may be electrically connected to the communication channel CH1.

The output driver 1110 may generate output data that may correspond to output data DATAP0 and DATAN0 output from a memory core (not shown). An impedance of the on-die termination circuit 1115 may be changed by a logic state of the read data mask signal RDM0 and the on-die termination enable signal ODTEN. That is, the on-die termination circuit 1115 may generate a termination resistance that may change according to the read data mask signal RDM0 and the on-die termination enable signal ODTEN, so as to provide the termination resistance to the output node DQ0.

Figure 3:
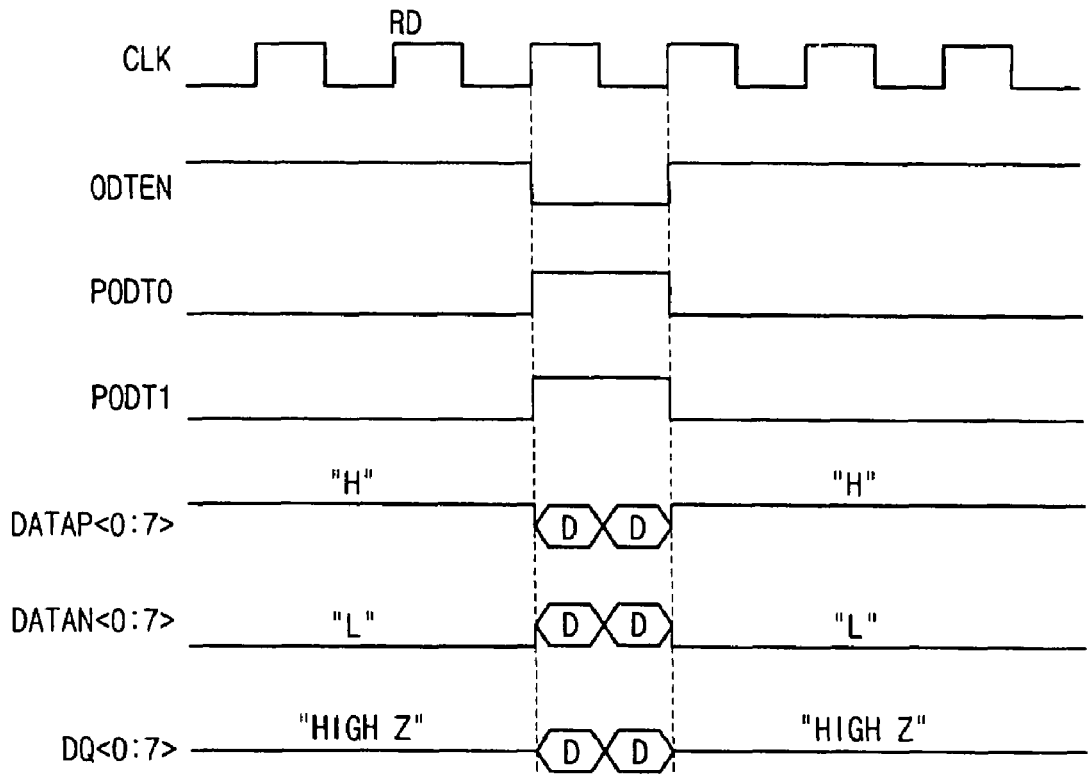
FIG. 3 illustrates a timing diagram of an operation of an output driving circuit of the semiconductor memory device in FIG. 1 in a normal mode.
Figure 4:
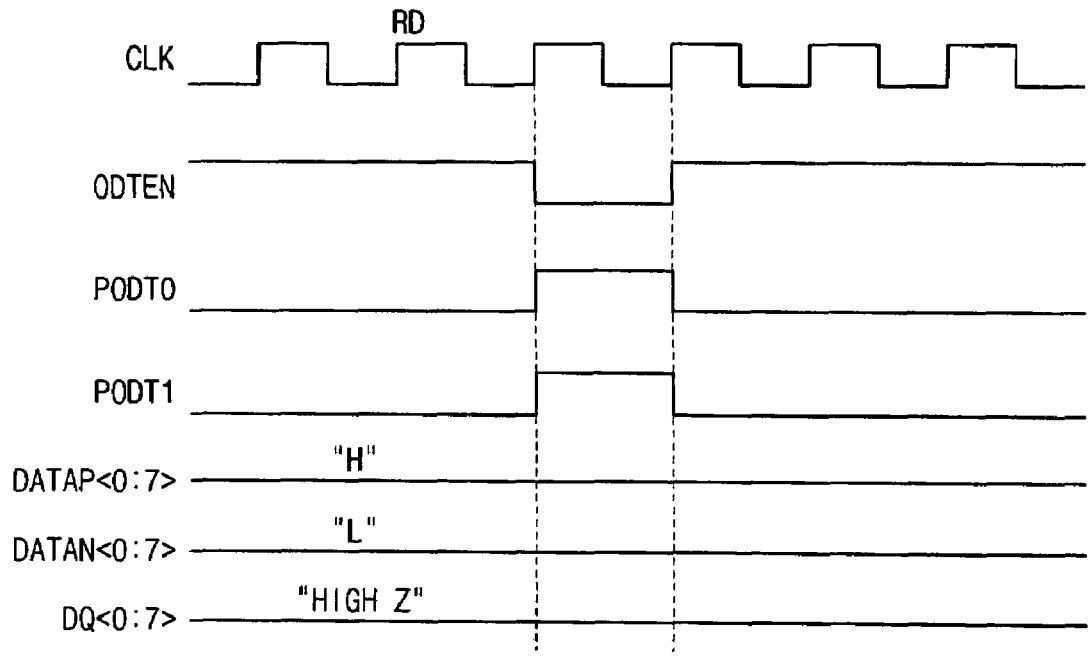
FIG. 4 illustrates a timing diagram of an operation of an output driving circuit of the semiconductor memory device in FIG. 1 in an on-die termination test mode.
Figure 5:
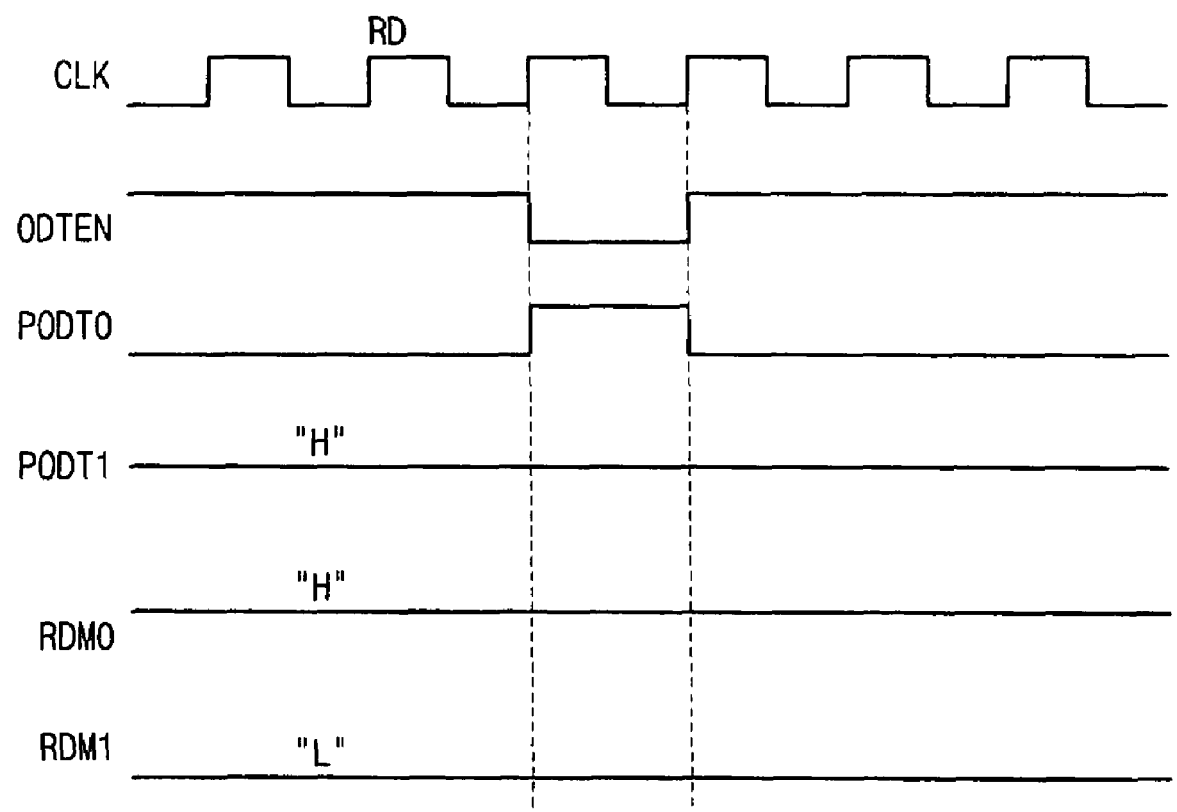
FIG. 5 illustrates a timing diagram of an operation of an output driving circuit of the semiconductor memory device in FIG. 1 in a merged-data line mode.

FIG. 3 illustrates a timing diagram of an operation of an output driving circuit of the semiconductor memory device 1100 in FIG. 1 in a normal mode. FIG. 4 illustrates a timing diagram of an operation of an output driving circuit of the semiconductor memory device 1100 in FIG. 1 in an on-die termination test mode. FIG. 5 illustrates a timing diagram of an operation of an output driving circuit of the semiconductor memory device 1100 in FIG. 1 in a merged-data line mode.

Hereinafter, with reference to FIGS. 1 through 5, an operation of a memory test system 1000 including an output driving circuit of the semiconductor memory device 1100 according to an example embodiment will be described.

The memory test system 1000 in FIG. 1 may be a merged-data line structure. As illustrated in FIG. 1, the output node DQ0 of the first output driving unit 1500 and the output node DQ4 of the second output driving unit 1600 may be electrically connected. The output node DQ1 of the first output driving unit 1500 and the output node DQ5 of the second output driving unit 1600 may be electrically connected. The output node DQ2 of the first output driving unit 1500 and the output node DQ6 of the second output driving unit 1600 may be electrically connected. The output node DQ3 of the first output driving unit 1500 and the output node DQ7 of the second output driving unit 1600 may be electrically connected. It should be appreciated that more (or less) output nodes may be included (or excluded) in the merged-data line structure. In an example embodiment, the semiconductor memory device 1100 may have eight input/output terminals and the tester 1400 may have four input/output terminals, e.g., the semiconductor memory device 1100 may have eight input/output pins DQ0 through DQ7 and the tester 1400 may have four input/output pins TDQ0 through TDQ3. The semiconductor memory device 1100 and the tester 1400 may transmit and receive data through the communication channels CH1 through CH4. The output nodes DQ0 through DQ7 (i.e., output pins) may be connected to an input circuit (not shown) as well as the output circuit in FIG. 1. As a matter of convenience, the input circuit is omitted in FIG. 1.

The on-die termination enable signal ODTEN may be a signal activating one or more of the on-die termination circuits 1115, 1125, 1135, 1145, 1155, 1165, 1175 and 1185. The on-die termination enable signal ODTEN may turn off the on-die termination circuits 1115, 1125, 1135, 1145, 1155, 1165, 1175 and 1185 in a read mode, and may turn on the on-die termination circuits 1115, 1125, 1135, 1145, 1155, 1165, 1175 and 1185 in a write mode. Because data of the communication channels CH1 through CH4 may be received through output pins in the write mode, the termination resistors RDET1 through RDET4 may be connected to the output nodes DQ0 through DQ7, so as to prevent or reduce distortion of the received data.

When a voltage of the output nodes DQ0 through DQ7 of the semiconductor memory device 1100 is high, a voltage of the communication channels CH1 through CH4 may also be high. When a voltage of the output nodes DQ0 through DQ7 of the semiconductor memory device 1100 is low, a voltage of the communication channels CH1 through CH4 may also be low. The pull-down circuit 1300 may include resistors RDET1 through RDET4 respectively connected between the communication channels CH1 through CH4 and a ground voltage. When a voltage of the output nodes DQ0 through DQ7 of the semiconductor memory device 1100 is low, the pull-down circuit 1300 may pull down the voltage of the communication channels CH1 through CH4. The tester 1400 may receive the voltage of the output nodes DQ0 through DQ7 from the communication channels CH1 through CH4 through input/output pins TDQ0 through TDQ3, and may test a logic state of the received voltage.

Referring back to FIG. 1, in the first output driving unit 1500, the output driver 1120 and the on-die termination circuit 1125 may be connected to the output node DQ1. The output driver 1130 and the on-die termination circuit 1135 may be connected to the output node DQ2. The output driver 1140 and the on-die termination circuit 1145 may be connected to the output node DQ3. Similarly, in the second output driving unit 1600, the output driver 1150 and the on-die termination circuit 1155 may be connected to the output node DQ4. The output driver 1160 and the on-die termination circuit 1165 may be connected to the output node DQ5. The output driver 1170 and the on-die termination circuit 1175 may be connected to the output node DQ6. The output driver 1180 and the on-die termination circuit 1185 may be connected to the output node DQ7.

It should be appreciated that the output drivers 1110, 1120, 1130, 1140, 1150, 1160, 1170 and 1180 and the on-die termination circuits 1115, 1125, 1135, 1145, 1155, 1165, 1175 and 1185 may each have a similar structure (as illustrated in FIG. 2). Alternatively, the output drivers 1110, 1120, 1130, 1140, 1150, 1160, 1170 and 1180 and the on-die termination circuits 1115, 1125, 1135, 1145, 1155, 1165, 1175 and 1185 may each have a different structure.

The on-die termination control signal generating circuit 1113 may control the on-die termination circuits 1115, 1125, 1135 and 1145, and the on-die termination control signal generating circuit 1153 may control the on-die termination circuits 1155, 1165, 1175 and 1185. The on-die termination control signal generating circuit 1113 may have a similar structure as the on-die termination control signal generating circuit 1153. Alternatively, the on-die termination control signal generating circuit 1113 and the on-die termination control signal generating circuit 1153 may be a different structure. The on-die termination control signal generating circuit 1153 may also include the NAND gate that may perform the NAND operation on the read data mask signal RDM1 and the on-die termination enable signal ODTEN, and may generate the on-die termination control signal PODT1.

Referring to FIG. 3, the on-die termination enable signal ODTEN may be generated in response to a read command in synchronization with a clock signal CLK. FIG. 3 illustrates an operation of the semiconductor memory device 1100 when clock latency is 1. The on-die termination enable signal ODTEN may be disabled during an output period of data in the read mode. In the read mode, because the termination resistance may not be required, the on-die termination circuits 1115, 1125, 1135, 1145, 1155, 1165, 1175 and 1185 may be turned OFF. The on-die termination control signals PODT0 and PODT1 may be high during the output period of data. Referring to FIG. 2 and FIG. 3, when the on-die termination control signals PODT0 and PODT1 are high, the PMOS transistor MP2 of the on-die termination circuit 1115 is turned OFF. In the output period of data, a gate of a pull-up transistor and a gate of a pull-down transistor included in the output drivers 1110, 1120, 1130, 1140, 1150, 1160, 1170 and 1180 may receive data to be output. In the other period (except the output period of data), the gate of the pull-up transistor may receive a high logic signal, and the gate of the pull-down transistor may receive a low logic signal. The output nodes DQ0 through DQ7 may maintain high impedance in the other period (except the output period of data).

Referring to FIG. 4, in an on-die termination test mode, the gate of the pull-up transistor may receive the high logic signal, and the gate of the pull-down transistor may receive the low logic signal. Therefore, the output nodes DQ0 through DQ7 may maintain high impedance. At this time, the voltage of the output nodes DQ0 through DQ7 may be measured by turning ON/OFF the on-die termination circuits 1115, 1125, 1135, 1145, 1155, 1165, 1175 and 1185. The on-die termination circuits 1115, 1125, 1135, 1145, 1155, 1165, 1175 and 1185 may operate in response to the on-die termination control signals PODT0 and PODT1 that may be generated from the on-die termination enable signal ODTEN. The merged-data line test mode may not be considered in the timing diagram of FIG. 4.

FIG. 5 illustrates an operation of an output driving circuit of the semiconductor memory device 1100 having a merged-data line structure in FIG. 1, e.g., when the on-die termination circuits 1115, 1125, 1135 and 1145 connected to the output nodes DQ0 through DQ3 of the first output driving unit 1500, and the on-die termination circuits 1155, 1165, 1175 and 1185 connected to the output nodes DQ4 through DQ7 of the second output driving unit 1600, are separately tested.

Referring to FIG. 2 and FIG. 5, when the read data mask signal RDM1 is low, the on-die termination control signal PODT1 may be high. As a result, the on-die termination circuits 1155, 1165, 1175 and 1185 connected to the output nodes DQ4 through DQ7 of a lower portion are turned OFF. Further, when the read data mask signal RDM0 is high, the on-die termination control signal PODT0 may have an inverted logic state of the on-die termination enable signal ODTEN. Further, when the on-die termination control signal PODT0 is low, the on-die termination circuits 1115, 1125, 1135 and 1145 are turned OFF, and when the on-die termination control signal PODT0 is high, the on-die termination circuits 1115, 1125, 1135 and 1145 are turned ON.

In the on-die termination test mode, the on-die termination control signal PODT0, which may be applied to the on-die termination circuits 1115, 1125, 1135 and 1145 connected to the output nodes DQ0 through DQ3 of the first output driving unit 1500, may be high only in a read mode. However, the on-die termination control signal PODT0 may be low other than in the read mode. The on-die termination control signal PODT1, which may be applied to the on-die termination circuits 1155, 1165, 1175 and 1185 connected to the output nodes DQ4 through DQ7 of the second output driving unit 1600, may be low. Therefore, the output nodes DQ4 through DQ7 of the second output driving unit 1600 may have high impedance, and the output nodes DQ0 through DQ3 of the first output driving unit 1500 may be high or low according to the logic state of the on-die termination enable signal ODTEN. The output nodes DQ0 through DQ3 of the first output driving unit 1500 and the output nodes DQ4 through DQ7 of the second output driving unit 1600 may be connected to the communication channels CH1 through CH4. When the on-die termination circuits 1115, 1125, 1135 and 1145 and the on-die termination circuits 1155, 1165, 1175 and 1185 are not active, the voltages of the communication channels CH1 through CH4 may all be low.

The tester 1400 may test whether the on-die termination circuits 1115, 1125, 1135, 1145, 1155, 1165, 1175 and 1185 may be turned ON or OFF by receiving the voltage of the communication channels CH1 through CH4 through input/output pins TDQ0 through TDQ3.

TABLE 1

|  | RDM0 = "H", RDM1 = "L" | | RDM0 = "L", RDM1 = "H" | |
|---|---|---|---|---|
|  | READ | WRITE | READ | WRITE |
| PODT0 | "H" | "L" | "H" | "H" |
| DATAP3 | "H" | "H" | "H" | "H" |
| DATAN3 | "L" | "L" | "L" | "L" |
| PODT1 | "H" | "H" | "H" | "L" |
| DATAP7 | "H" | "H" | "H" | "H" |
| DATAN7 | "L" | "L" | "L" | "L" |

Table 1 illustrates logic states of respective signals when the on-die termination test is performed in the read mode and/or in the write mode. Table 1 shows logic states of input signals DATAP3, DATAN3 applied to the output driver 1140, input signals DATAP7, DATAN7 applied to the output driver 1180 of the semiconductor memory device 1100 having the merged-data line structure according to a logic state of the read data mask signals RDM0 and RDM1, and the on-die termination control signals PODT0 and PODT1. In Table 1, H represents a logic high state, and L represents a logic low state.

Referring to Table 1, the operation of the memory test system 1000 in FIG. 1, e.g., when the read data mask signal RDM0 is high and the read data mask signal RDM1 is low, will be described as follows.

Both in the read mode and in the write mode, a high logic signal (instead of the input data DATAP3) may be applied to the gate of the pull-up transistor of the output driver 1140, and a low logic signal (instead of the input data DATAN3) may be applied to the gate of the pull-down transistor of the output driver 1140. Therefore, the pull-up transistor and the pull-down transistor of output driver 1140 may be turned OFF, and the output node DQ3 may be in high impedance. Further, a high logic signal (instead of the input data DATAP7) may be applied to the gate of the pull-up transistor of the output driver 1180, and a low logic signal (instead of the input data DATAN7) may be applied to the gate of the pull-down transistor of the output driver 1180. Therefore, the pull-up transistor and the pull-down transistor of output driver 1180 may be turned OFF, and the output node DQ7 may be in high impedance.

Referring to FIG. 3, the on-die termination enable signal ODTEN may be low (i.e., disable state) in the read mode, and may otherwise be high (i.e., enable state). Referring to FIGS. 1 and 2, and Table 1, during the read mode, the on-die termination control signal PODT1 may be high irrespective of the read data mask signals RDM0 and RDM1, and the on-die termination circuits 1145 and 1185 may be turned OFF. In other words, during the read mode, due to a switching transistor in the on-die termination circuit 1145 being turned OFF, the termination resistor may not influence the output nodes DQ3 and DQ7.

In the write mode, the on-die termination enable signal ODTEN may be high (i.e., enable state). During the write mode, when the read data mask signal RDM0 is high and the read data mask signal RDM1 is low, the on-die termination control signal PODT0 may be low and the on-die termination control signal PODT1 may be high. Therefore, the on-die termination circuit 1155 may be turned ON, and the on-die termination circuit 1185 may be turned OFF. In other words, because a switching transistor in the on-die termination circuit 1145 is turned ON, the termination resistor may be electrically connected to the power voltage VDD and the output node DQ3, and alternatively, because the switching transistor in on-die termination circuit 1185 is turned OFF, the termination resistor may not influence the output node DQ7.

The operation of the memory test system 1000 of FIG. 1, when the read data mask signal RDM0 is low and the read data mask signal RDM1 is high, will be described as follows.

Both in the read mode and in the write mode, a high logic signal (instead of the input data DATAP3) may be applied to the gate of the pull-up transistor of the output driver 1140, and a low logic signal (instead of the input data DATAN3) may be applied to the gate of the pull-down transistor of the output driver 1140. Therefore, the pull-up transistor and the pull-down transistor of output driver 1140 may be turned OFF, and the output node DQ3 may be in high impedance. Further, a high logic signal (instead of the input data DATAP7) may be applied to the gate of the pull-up transistor of the output driver 1180, and a low logic signal (instead of the input data DATAN7) may be applied to the gate of the pull-down transistor of the output driver 1180. Therefore, the pull-up transistor and the pull-down transistor of output driver 1180 may be turned OFF, and the output node DQ7 may be in high impedance.

The on-die termination enable signal ODTEN may be low (i.e., disable state) in the read mode, and may otherwise be high (i.e., enable state). Referring to FIGS. 1 and 2, and Table 1, during the read mode, the on-die termination control signals PODT0 and PODT1 may be high irrespective of the read data mask signals RDM0 and RDM1, and the on-die termination circuits 1145 and 1185 may be turned OFF, in the read mode. In other words, during the read mode, due to the switching transistor in the on-die termination circuit 1145 being turned OFF, the termination resistor may not influence the output nodes DQ3 and DQ7.

In the write mode, the on-die termination enable signal ODTEN may be high (i.e., enable state). During the write mode, when the read data mask signal RDM0 may be low and the read data mask signal RDM1 may be high, the on-die termination control signal PODT0 may be high and the on-die termination control signal PODT1 may be low. Therefore, the on-die termination circuit 1145 may be turned OFF and the on-die termination circuit 1185 may be turned ON. In other words, because a switching transistor in the on-die termination circuit 1145 is turned OFF, the termination resistor may not influence the output node DQ3, and alternatively, because the switching transistor in the on-die termination circuit 1185 may be turned ON, the termination resistor may be electrically connected to the power voltage VDD and the output node DQ7.

As mentioned above, in the on-die termination test mode, the memory test system 1000 according to an example embodiment may turn OFF the output drivers of the semiconductor memory device 1000, and may maintain the output nodes DQ0 through DQ7 in high impedance. In the on-die termination test mode, the pull-up transistor and the pull-down transistor in each of the output drivers 1110, 1120, 1130, 1140, 1150, 1160, 1170 and 1180 may be turned OFF by a mode register set (MRS) signal that may be related with the on-die termination test.

TABLE 2

| RDM0 | RDM1 | DQ0~DQ3 | DQ4~DQ7 | COMMENT |
|---|---|---|---|---|
| "H" | "H" | Normal Op. | Normal Op. | — |
| "H" | "L" | Normal Op. | High-Z | DQ0~DQ3 Test |
| "L" | "H" | High-Z | Normal Op. | DQ4~DQ7 Test |
| "L" | "L" | High-Z | High-Z | — |

Table 2 illustrates logic states of respective signals when the on-die termination test is performed in the read mode and in the write mode. Table 2 shows logic states of the output nodes DQ0 through DQ7 according to a logic state of the read data mask signals RDM0 and RDM1. In Table 2, H represents a high logic state, and L represents a low logic state.

In an example embodiment, when read data mask signals RDM0 and RDM1 are high, the on-die termination circuits 1115, 1125, 1135 and 1145; and 1155, 1165, 1175 and 1185 may be activated, respectively; and alternatively, when read data mask signals RDM0 and RDM1 may be enabled when the read data mask signals RDM0 and RDM1 are low, the on-die termination circuits 1115, 1125, 1135 and 1145; and 1155, 1165, 1175 and 1185 may be activated, respectively.

Referring to Table 2, when the read data mask signals RDM0 and RDM1 are high, all of the output nodes DQ0 through DQ7 may perform a normal operation. At this time, the merged test may not be performed by using the memory test system 1000 having the merged-data line of FIG. 1. The merged test may be performed when one of the read data mask signals RDM0 and RDM1 is enabled. For example, when the read data mask signal RDM0 is high and the read data mask signal RDM1 is low, the output nodes DQ0 through DQ3 may perform a normal operation and the output nodes DQ4 through DQ7 may maintain high impedance. When the read data mask signal RDM0 is low and the read data mask signal RDM1 is high, the output nodes DQ0 through DQ3 may maintain high impedance, and the output nodes DQ4 through DQ7 may perform a normal operation. When the read data mask signals RDM0 and RDM1 are both low, all of the output nodes DQ0 through DQ7 may maintain high impedance.

Figure 6:
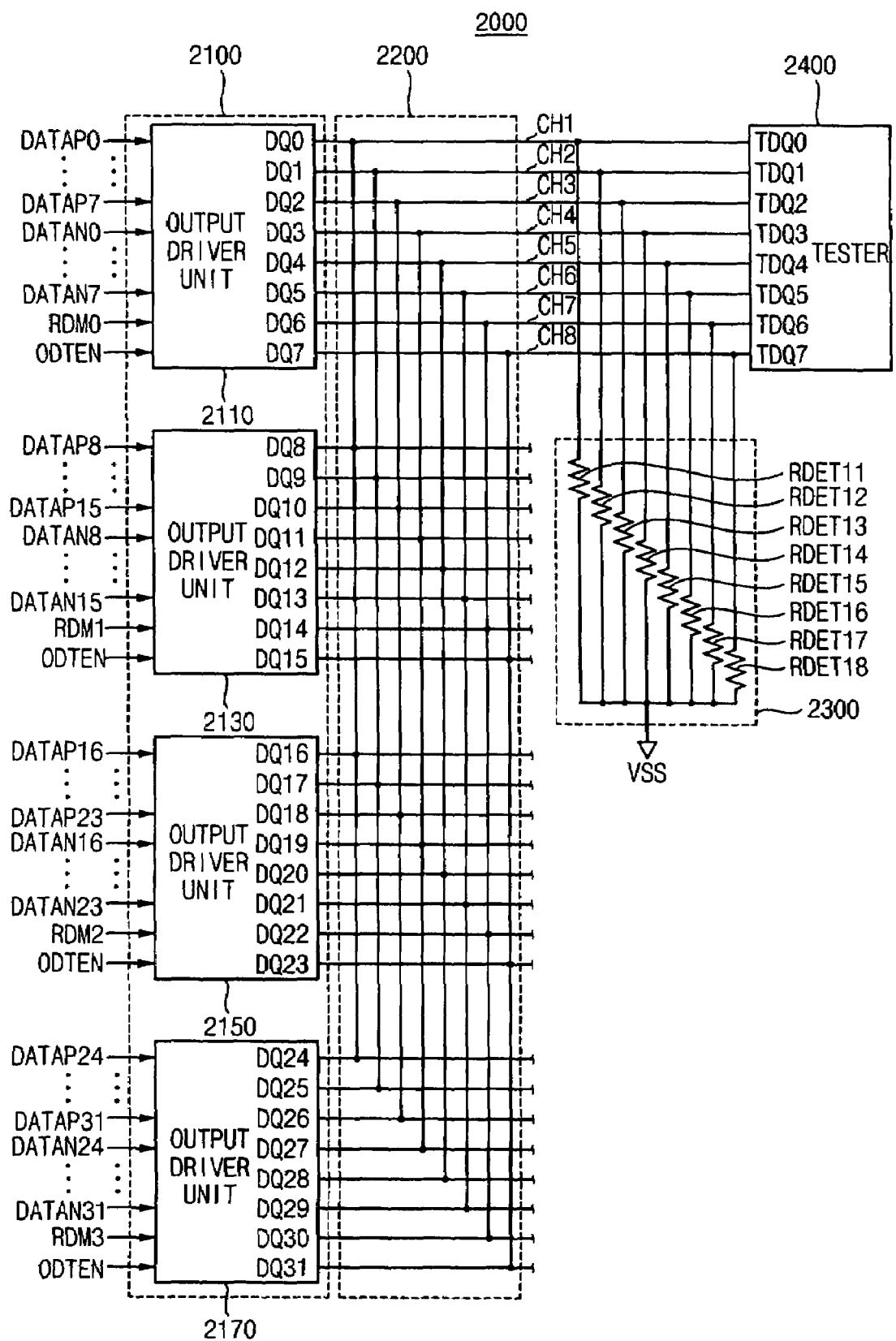
FIG. 6 illustrates a circuit diagram of a memory test system including a semiconductor memory device according to another example embodiment.

FIG. 6 illustrates a circuit diagram of a memory test system 2000 according to another example embodiment.

Referring to FIG. 6, the memory test system 2000 may include a semiconductor memory device 2100, a coupling circuit 2200, a pull-down circuit 2300 and a tester 2400. The memory test system 2000 may test an on-die termination circuit of the semiconductor memory device 2100 having thirty two input/output terminals. It should be appreciated that the semiconductor memory device 2100 may include other components, e.g., a memory core.

Further, output nodes and the output pins may be commonly represented as DQ0 through DQ31 because output nodes of the semiconductor memory device 2100 are respectively coupled to output pins.

The semiconductor memory device 2100 may include a first output driving unit 2110, a second output driving unit 2130, a third output driving unit 2150 and a fourth output driving unit 2170. The second output driving unit 2130 may operate in response to the read data mask signal RDM0 and an on-die termination enable signal ODTEN. The second output driving unit 2130 may operate in response to a read data mask signal RDM1 and the on-die termination enable signal ODTEN. The third output driving unit 2150 may operate in response to a read data mask signal RDM2 and the on-die termination enable signal ODTEN. The fourth output driving unit 2170 may operate in response to a read data mask signal RDM3 and the on-die termination enable signal ODTEN.

The semiconductor memory device 2100 may maintain the output nodes DQ0 through DQ31 at high impedance by turning OFF a corresponding output driving circuit while an on-die termination circuit is tested. The coupling circuit 2200 respectively may connect the output nodes DQ0 through DQ7 of the first output driving unit 2110, the output nodes DQ8 through DQ15 of the second output driving unit 2130, the output nodes DQ16 through DQ23 of the third output driving unit 2150, and the output nodes DQ24 through DQ31 of the fourth output driving unit 2170 to the communication channels CH1 through CH8. The pull-down circuit 2300 may include resistors RDET11 through RDET18 respectively coupled to communication channels CH1 through CH8. The pull-down circuit 2300 respectively may pull down voltages of the communication channels CH1 through CH8. The tester 2400 may include input/output pins TDQ0 through TDQ7, and may test a logic state of a voltage of the communication channels CH1 through CH8.

The first output driving unit 2110 may generate output data by receiving data DATAP0 through DATAP7 and DATAN0 through DATAN7, and may provide the output data to the output nodes DQ0 through DQ7. The second output driving unit 2130 may generate output data by receiving data DATAP8 through DATAP15 and DATAN8 through DATAN15, and may provide the output data to the output nodes DQ8 through DQ15. The third output driving unit 2150 may generate output data by receiving data DATAP16 through DATAP23 and DATAN16 through DATAN23, and may provide the output data to the output nodes DQ16 through DQ23. The fourth output driving unit 2170 may generate output data by receiving data DATAP24 through DATAP31 and DATAN24 through DATAN31, and may provide the output data to the output nodes DQ24 through DQ31.

Figure 7:
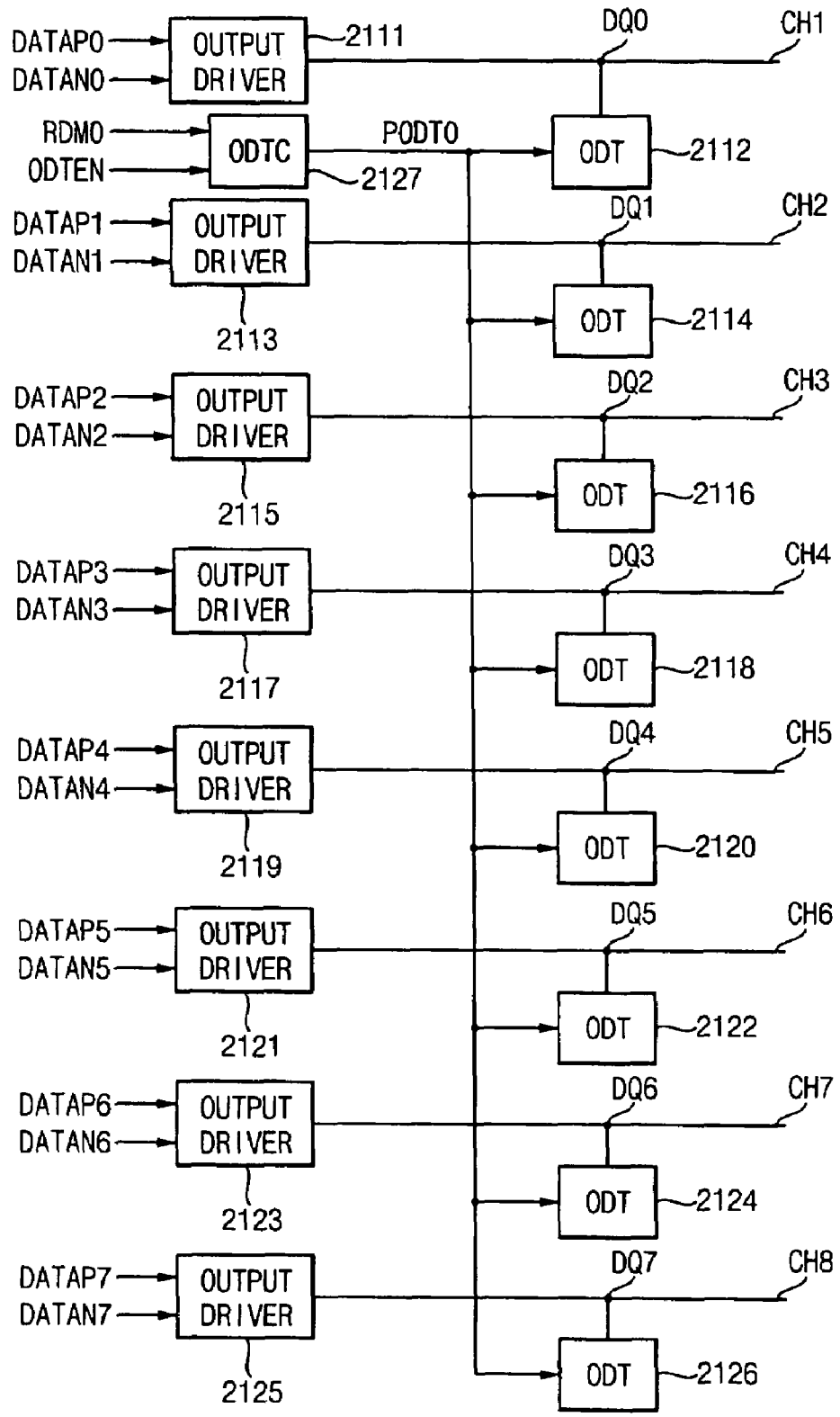
FIG. 7 illustrates a block diagram of a first output driving unit 2110 of an output driving circuit of the semiconductor memory device 2000 in FIG. 6.

FIG. 7 illustrates a block diagram of a first output driving unit 2110 of an output driving circuit of the semiconductor memory device 2000 of FIG. 6.

Referring to FIG. 7, the first output driving unit 2110 may include output drivers 2111, 2113, 2115, 2117, 2119, 2121, 2123 and 2125, on-die termination control signal generating circuits 2127 and on-die termination circuits 2112, 2114, 2116, 2118, 2120, 2122, 2124 and 2126.

The output driver 2111 may generate output data by receiving a pair of data DATAP0 and DATAN0, and may provide the output data to the output node DQ0. The on-die termination control signal generating circuit 2127 may generate an on-die termination control signal PODT0 in response to a read data mask signal RDM0 and an on-die termination enable signal ODTEN. The on-die termination circuit 2112 may generate a termination resistance in response to the on-die termination control signal PODT0, and provide the termination resistance to the output node DQ0. The output driver 2113 may generate output data by receiving a pair of data DATAP1 and DATAN1, and may provide the output data to the output node DQ1. The on-die termination circuit 2114 may generate a termination resistance in response to the on-die termination control signal PODT0, and may provide the termination resistance to the output node DQ1. The output driver 2115 may generate output data by receiving a pair of data DATAP2 and DATAN2, and may provide the output data to the output node DQ2. The on-die termination circuit 2116 may generate a termination resistance in response to the on-die termination control signal PODT0, and may provide the termination resistance to the output node DQ2. The output driver 2117 may generate output data by receiving a pair of data DATAP3 and DATAN3, and may provide the output data to the output node DQ3. The on-die termination circuit 2118 may generate a termination resistance in response to the on-die termination control signal PODT0, and may provide the termination resistance to the output node DQ3. The output driver 2119 may generate output data by receiving a pair of data DATAP4 and DATAN4, and may provide the output data to the output node DQ4. The on-die termination circuit 2120 may generate a termination resistance in response to the on-die termination control signal PODT0, and may provide the termination resistance to the output node DQ4. The output driver 2121 may generate output data by receiving a pair of data DATAP5 and DATAN5, and may provide the output data to the output node DQ5. The on-die termination circuit 2122 may generate a termination resistance in response to the on-die termination control signal PODT0, and may provide the termination resistance to the output node DQ5. The output driver 2123 generates output data by receiving a pair of data DATAP6 and DATAN6, and may provide the output data to the output node DQ6. The on-die termination circuit 2124 generates a termination resistance in response to the on-die termination control signal PODT0, and may provide the termination resistance to the output node DQ6. The output driver 2125 may generate output data by receiving a pair of data DATAP7 and DATAN7, and may provide the output data to the output node DQ7. The on-die termination circuit 2126 may generate a termination resistance in response to the on-die termination control signal PODT0, and may provide the termination resistance to the output node DQ7.

Further, the output nodes DQ0 through DQ7 may respectively be connected to communication channels CH1 through CH8. For example, the output node DQ0 may be electrically connected to a communication channel CH1, the output node DQ1 may be electrically connected to a communication channel CH2, the output node DQ2 may be electrically connected to a communication channel CH3, the output node DQ3 may be electrically connected to a communication channel CH4, the output node DQ4 may be electrically connected to a communication channel CH5, the output node DQ5 may be electrically connected to a communication channel CH6, the output node DQ6 may be electrically connected to a communication channel CH7, and the output node DQ7 may be electrically connected to a communication channel CH8.

The second output driving unit 2130, the third output driving unit 2150, and the fourth output driving unit 2170 (as illustrated in FIG. 6) may have a similar structure as the first output driving unit 2110 (as illustrated in FIG. 7), except for having different input/output signals and different input/output nodes from the first output driving unit 2110. In other words, the second output driving unit 2130 may generate output data by receiving data DATAP8 through DATAP15 and DATAN8 through DATAN15, and may provide the output data to the output nodes DQ8 through DQ15, so as to generate a termination resistance in response to a read data mask signal RDM1 and the on-die termination enable signal ODTEN, and provide the termination resistance to the output nodes DQ8 through DQ15. The third output driving unit 2150 may generate output data by receiving data DATAP16 through DATAP23 and DATAN16 through DATAN23, and may provide the output data to an output nodes DQ16 through DQ23, so as to generate a termination resistance in response to a read data mask signal RDM2 and the on-die termination enable signal ODTEN, and provide the termination resistance to the output nodes DQ16 through DQ23. The fourth output driving unit 2170 may generate output data by receiving data DATAP24 through DATAP31 and DATAN24 through DATAN31, and may provide the output data to an output nodes DQ24 through DQ31, so as to generate a termination resistance in response to a read data mask signal RDM3 and the on-die termination enable signal ODTEN, and provide the termination resistance to the output node DQ24 through DQ31.

Referring to FIGS. 6 and 7, each of the output driving units 2110, 2130, 2150 and 2170 may include an on-die termination control signal generating circuit. For example, the first output driving unit 2110 may include an on-die termination control signal generating circuit 2127 that may generate an on-die termination control signal PODT0 in response to the read data mask signal RDM0 and the on-die termination enable signal ODTEN. The second output driving unit 2130 may include an on-die termination control signal generating circuit (not shown) that may generate an on-die termination control signal PODT1 in response to the read data mask signal RDM1 and the on-die termination enable signal ODTEN. The third output driving unit 2150 may include an on-die termination control signal generating circuit (not shown) that may generate an on-die termination control signal PODT2 in response to the read data mask signal RDM2 and the on-die termination enable signal ODTEN. The fourth output driving unit 2170 may include an on-die termination control signal generating circuit (not shown) that may generate an on-die termination control signal PODT3 in response to the read data mask signal RDM3 and the on-die termination enable signal ODTEN.

In another example embodiment, the semiconductor memory device 2100 may include a single on-die termination control signal generating circuit that may generate on-die termination control signals PODT0, PODT1, PODT2 and PODT3 in response to the read data mask signals RDM0, RDM1, RDM2 and RDM3 and the on-die termination enable signal ODTEN. It should be appreciated that the on-die termination control signal generating circuit may be located outside of the output driving units 2110, 2130, 2150 and 2170.

Hereinafter, with reference to FIGS. 6 and 7, an operation of the memory test system 2000 including an output driving circuit of the semiconductor memory device 2100 according to another example embodiment is described.

Referring to FIG. 6, the memory test system 2000 may have a merged-data line structure, which may include thirty two data input/output terminals. Further, the output node DQ0 of the first output driving unit 2110, the output node DQ8 of the second output driving unit 2130, the output node DQ16 of the third output driving unit 2150, and the output node DQ24 of the fourth output driving unit 2170 may be electrically connected. Further, the output node DQ1 of the first output driving unit 2110, the output node DQ9 of the second output driving unit 2130, the output node DQ17 of the third output driving unit 2150, and the output node DQ25 of the fourth output driving unit 2170 may be electrically connected. Further, the output node DQ2 of the first output driving unit 2110, the output node DQ10 of the second output driving unit 2130, the output node DQ18 of the third output driving unit 2150, and the output node DQ26 of the fourth output driving unit 2170 may be electrically connected. Further, the output node DQ3 of the first output driving unit 2110, the output node DQ11 of the second output driving unit 2130, the output node DQ19 of the third output driving unit 2150, and the output node DQ27 of the fourth output driving unit 2170 may be electrically connected. Further, the output node DQ4 of the first output driving unit 2110, the output node DQ12 of the second output driving unit 2130, the output node DQ20 of the third output driving unit 2150, and the output node DQ28 of the fourth output driving unit 2170 may be electrically connected. Further, the output node DQ5 of the first output driving unit 2110, the output node DQ13 of the second output driving unit 2130, the output node DQ21 of the third output driving unit 2150, and the output node DQ29 of the fourth output driving unit 2170 may be electrically connected. Further, the output node DQ6 of the first output driving unit 2110, the output node DQ14 of the second output driving unit 2130, the output node DQ22 of the third output driving unit 2150, and the output node DQ30 of the fourth output driving unit 2170 may be electrically connected. Further, the output node DQ7 of the first output driving unit 2110, the output node DQ15 of the second output driving unit 2130, the output node DQ23 of the third output driving unit 2150, and the output node DQ31 of the fourth output driving unit 2170 may be electrically connected. In the memory test system 2000, the semiconductor memory device 2100 may have thirty two input/output terminals and the tester 2400 may have eight input/output terminals, e.g., the semiconductor memory device 2100 may have thirty two input/output pins DQ0 through DQ31 and the tester 2400 may have eight input/output pins TDQ0 through TDQ7. The semiconductor memory device 2100 and the tester 2400 may transmit and receive data through the communication channels CH1 through CH8. The output nodes DQ0 through DQ31 (i.e., output pins) may be connected to an input circuit (not shown) as well as the output circuit. The memory test system 2000 may generate the on-die termination control signals PODT0, PODT1, PODT2 and PODT3 in response to the read data mask signals RDM0, RDM1, RDM2 and RDM3 and the on-die termination enable signal ODTEN, and may test the on-die termination circuits 2112, 2114, 2116, 2118, 2120, 2122, 2124 and 2126 connected to the eight output nodes at once, e.g., the on-die termination circuits 2112, 2114, 2116, 2118, 2120, 2122, 2124 and 2126 may be included in an output driving unit among the output driving units that are tested at once. The on-die termination circuits 2112, 2114, 2116, 2118, 2120, 2122, 2124 and 2126 of the output driving units (that are not tested) may be turned OFF, e.g., the output nodes DQ0 through DQ31 of the output driving units that are not tested may maintain high impedance.

The memory test system 2000, in the on-die termination test mode, may turn off the output drivers of the semiconductor memory device 2100, and may maintain the output nodes DQ0 through DQ31 at high impedance. Further, in the on-die termination test mode, a pull-up transistor and a pull-down transistor in each of the output drivers may be turned off by a mode register set (MRS) signal related with the on-die termination test.

Because the operation of the memory test system 2000 in FIG. 6 may be similar to the operation of the memory test system in FIG. 1, the repeated description will be omitted.

Figure 8:
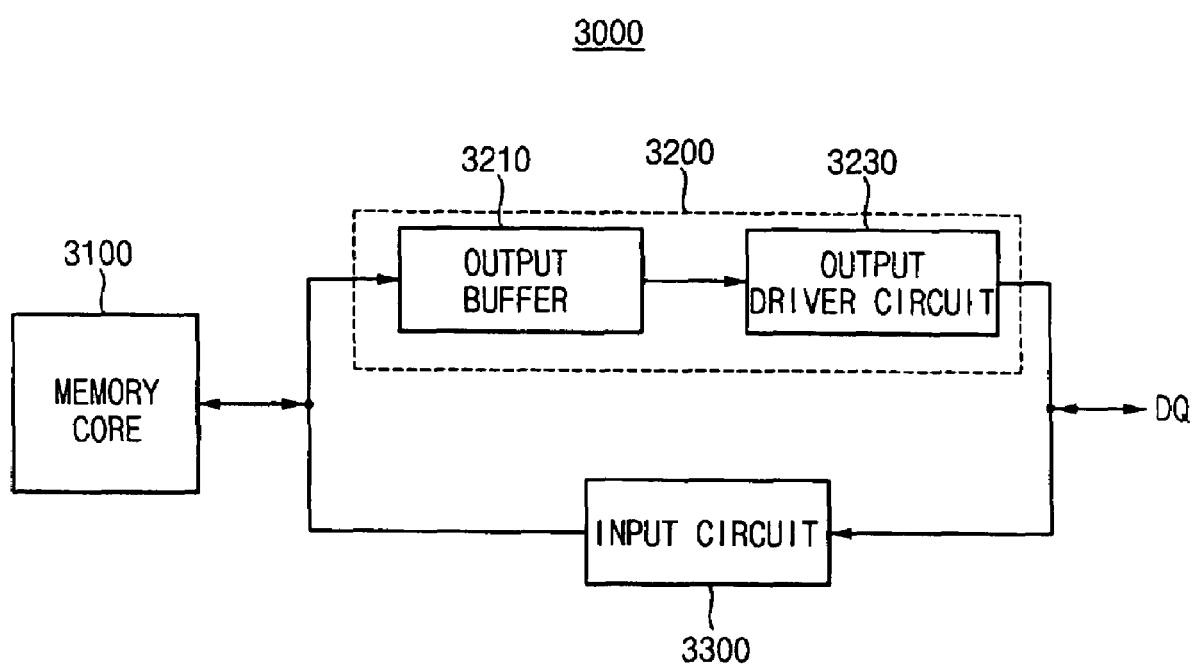
FIG. 8 illustrates a block diagram of a configuration of a semiconductor memory device according to an example embodiment.

FIG. 8 illustrates a block diagram of a configuration of a semiconductor memory device according to an example embodiment.

Referring to FIG. 8, the semiconductor memory device 3000 may include a memory core 3100, an output circuit 3200, and an input circuit 3300. The output circuit 3200 may include an output buffer 3210 and an output driving unit 3230.

The input circuit 3300 may buffer data received from an output node DQ, and may provide the buffered data to the memory core 3100. The memory core 3100 may store or output the data received from the input circuit 3300. The output circuit 3200 may buffer the data output from the memory core 3100, and may provide the buffered output data to the output node DQ.

The output buffer 3210 may determine an output order of the output data from the memory core 3100, and may select an output bit construction, so as to perform a parallel-series conversion. The output driving unit 3230 may generate output data that may drive an external of the semiconductor memory device 3000 in response to an output signal of the output buffer 3210.

Example embodiments may provide a memory test system including a semiconductor memory device to test an on-die termination circuit by using a tester having a small number of channels.

In the figures, the dimensions of regions may be exaggerated for clarity of illustration. It will also be understood that when an element is referred to as being "on" another element or substrate, it can be directly on the other element or substrate, or intervening elements may also be present. Further, it will be understood that when a element is referred to as being "under" another element, it can be directly under, and one or more intervening elements may also be present. In addition, it will also be understood that when an element is referred to as being "between" two elements, it can be the only layer between the two elements, or one or more intervening elements may also be present. Like reference numerals refer to like elements throughout.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory test system, comprising:
a semiconductor memory device having a plurality first output nodes and a plurality of second output nodes, the first output nodes being connected to respective first on-die termination circuits that are not tested, and the second output nodes being connected to second on-die termination circuits that are tested, the semiconductor memory device configured to generate test signals of the second on-die termination circuits and to provide the test signals to the second output nodes;
a coupling circuit configured to connect the first output nodes and the second output nodes to communication channels, respectively; and
a tester configured to test a logic state of the test signals of the communication channels.

2. The memory test system as claimed in claim 1, wherein the first output nodes are maintained at high impedance in an on-die termination test mode.

3. The memory test system as claimed in claim 1, further comprising:
a pull-down circuit configured to pull down voltages of communication channels when the first and second on-die termination circuits are deactivated.

4. The memory test system as claimed in claim 3, wherein the pull-down circuit includes detection resistors respectively connected between each of the communication channels and a ground voltage.

5. The memory test system as claimed in claim 3, wherein the semiconductor memory device includes output drivers respectively connected to each of the first and second output nodes.

6. The memory test system as claimed in claim 3, wherein the output drivers are turned off in an on-die termination test mode.

7. The memory test system as claimed in claim 1, wherein a number of the first output nodes corresponds to M, a number of the second output nodes corresponds to N, and a number of the communication channels corresponds to (M+N)/2, M and N being natural numbers.

8. The memory test system as claimed in claim 7, wherein the semiconductor memory device has eight input/output terminals.

9. The memory test system as claimed in claim 8, wherein M and N are equal to four.

10. The memory test system as claimed in claim 3, wherein the semiconductor memory device further comprises:
   a first output driving unit configured to operate in response to an on-die termination enable signal and a first read data mask signal; and
   a second output driving unit configured to operate in response to the on-die termination enable signal and a second read data mask signal.

11. The memory test system as claimed in claim 10, wherein the first output driving unit comprises:
   a first on-die termination control signal generating circuit configured to generate a first on-die termination control signal in response to the on-die termination enable signal and the first read data mask signal;
   a first output driver configured to generate first output data in response to first data so as to provide the first output data to a first output node;
   a first on-die termination circuit configured to operate in response to the first on-die termination control signal, the first on-die termination circuit being connected to the first output node;
   a second output driver configured to generate second output data in response to second data so as to provide the second output data to a second output node;
   a second on-die termination circuit configured to operate in response to the first on-die termination control signal, the second on-die termination circuit being connected to the second output node;
   a third output driver configured to generate third output data in response to third data so as to provide the third output data to a third output node;
   a third on-die termination circuit configured to operate in response to the first on-die termination control signal, the third on-die termination circuit being connected to the third output node;
   a fourth output driver configured to generate fourth output data in response to fourth data so as to provide the fourth output data to a fourth output node; and
   a fourth on-die termination circuit configured to operate in response to the first on-die termination control signal, the fourth on-die termination circuit being connected to the fourth output node.

12. The memory test system as claimed in claim 11, wherein the first, second, third and fourth data respectively correspond to output data of a memory core in the semiconductor memory device.

13. The memory test system as claimed in claim 11, wherein the first, second, third and fourth output drivers are turned off so as to maintain the first, second, third and fourth output nodes at high impedance in an on-die termination test mode.

14. The memory test system as claimed in claim 10, wherein the second output driving unit comprises:
   a second on-die termination control signal generating circuit configured to generate a second on-die termination control signal in response to the on-die termination enable signal and the second read data mask signal;
   a fifth output driver configured to generate fifth output data in response to fifth data so as to provide the fifth output data to a fifth output node;
   a fifth on-die termination circuit configured to operate in response to the second on-die termination control signal, the fifth on-die termination circuit being connected to the fifth output node;
   a sixth output driver configured to generate sixth output data in response to sixth data so as to provide the sixth output data to a sixth output node;
   a sixth on-die termination circuit configured to operate in response to the second on-die termination control signal, the sixth on-die termination circuit being connected to the sixth output node;
   a seventh output driver configured to generate seventh output data in response to seventh data so as to provide the seventh output data to a seventh output node;
   a seventh on-die termination circuit configured to operate in response to the second on-die termination control signal, the seventh on-die termination circuit being connected to the seventh output node;
   a eighth output driver configured to generate eighth output data in response to eighth data so as to provide the eighth output data to a eighth output node; and
   a eighth on-die termination circuit configured to operate in response to the second on-die termination control signal, the eighth on-die termination circuit being connected to the eighth output node.

15. The memory test system as claimed in claim 14, wherein the fifth, sixth, seventh and eighth data respectively correspond to output data of a memory core in the semiconductor memory device.

16. The memory test system as claimed in claim 14, wherein the fifth, sixth, seventh and eighth output drivers are turned off so as to maintain the fifth, sixth, seventh and eighth output nodes at high impedance in an on-die termination test mode.

17. The memory test system as claimed in claim 7, wherein the semiconductor memory device has thirty two input/output terminals.

18. The memory test system as claimed in claim 17, wherein M and N are equal to eight.

19. The memory test system as claimed in claim 18, wherein the semiconductor memory device comprises:
   a first output driving unit configured to operate in response to an on-die termination enable signal and a first read data mask signal;
   a second output driving unit configured to operate in response to the on-die termination enable signal and a second read data mask signal;
   a third output driving unit configured to operate in response to the on-die termination enable signal and a third read data mask signal; and
   a fourth output driving unit configured to operate in response to the on-die termination enable signal and a fourth read data mask signal.

20. The memory test system as claimed in claim 19, wherein the first output driving unit comprises:
   a first on-die termination control signal generating circuit configured to generate a first on-die termination control signal in response to the on-die termination enable signal and the first read data mask signal;

a first output driver configured to generate first output data in response to first data so as to provide the first output data to a first output node;

a first on-die termination circuit configured to operate in response to the first on-die termination control signal, the first on-die termination circuit being connected to the first output node;

a second output driver configured to generate second output data in response to second data so as to provide the second output data to a second output node;

a second on-die termination circuit configured to operate in response to the first on-die termination control signal, the second on-die termination circuit being connected to the second output node;

a third output driver configured to generate third output data in response to third data so as to provide the third output data to a third output node;

a third on-die termination circuit configured to operate in response to the first on-die termination control signal, the third on-die termination circuit connected to the third output node;

a fourth output driver configured to generate fourth output data in response to fourth data so as to provide the fourth output data to a fourth output node;

a fourth on-die termination circuit configured to operate in response to the first on-die termination control signal, the fourth on-die termination circuit being connected to the fourth output node;

a fifth output driver configured to generate fifth output data in response to fifth data so as to provide the fifth output data to a fifth output node;

a fifth on-die termination circuit configured to operate in response to the first on-die termination control signal, the fifth on-die termination circuit being connected to the fifth output node;

a sixth output driver configured to generate sixth output data in response to sixth data so as to provide the sixth output data to a sixth output node;

a sixth on-die termination circuit configured to operate in response to the first on-die termination control signal, the sixth on-die termination circuit being connected to the sixth output node;

a seventh output driver configured to generate seventh output data in response to seventh data so as to provide the seventh output data to a seventh output node;

a seventh on-die termination circuit configured to operate in response to the first on-die termination control signal, the seventh on-die termination circuit being connected to the seventh output node;

a eighth output driver configured to generate eighth output data in response to eighth data so as to provide the eighth output data to a eighth output node; and a eighth on-die termination circuit configured to operate in response to the first on-die termination control signal, the eighth on-die termination circuit being connected to the eighth output node.

21. The memory test system as claimed in claim 1, wherein the semiconductor memory device includes an output driving circuit configured to generate output data in response to data so as to output the output data in an active mode; and a memory core configured to generate the data.

22. A method of testing a semiconductor memory device, comprising:

providing a plurality of first output nodes and a plurality of second output nodes, the first output nodes being connected to first on-die termination circuits that are not tested and the second output nodes being connected to second on-die termination circuits that are tested;

generating test signals of the second on-die termination circuits to provide the test signals to the second output nodes in an on-die termination test mode;

coupling the first output nodes and the second output nodes to communication channels, respectively; and testing a logic state of the test signals of the communication channels.

23. The method of testing a semiconductor memory device as claimed in claim 22, wherein the first output nodes are maintained at high impedance in the on-die termination test mode.

* * * * *